United States Patent
Kozawa et al.

(10) Patent No.: US 8,476,346 B2
(45) Date of Patent: Jul. 2, 2013

(54) RESIST PATTERN THICKENING MATERIAL, SEMICONDUCTOR DEVICE, AND PRODUCTION METHOD THEREOF

(75) Inventors: Miwa Kozawa, Kawasaki (JP); Koji Nozaki, Kawasaki (JP)

(73) Assignee: Fujitsu Limited, Kawasaki-shi (JP)

( * ) Notice: Subject to any disclaimer, the term of this patent is extended or adjusted under 35 U.S.C. 154(b) by 659 days.

(21) Appl. No.: 12/713,876

(22) Filed: Feb. 26, 2010

(65) Prior Publication Data

US 2011/0101508 A1    May 5, 2011

(30) Foreign Application Priority Data

Nov. 4, 2009   (JP) .................................. 2009-252800

(51) Int. Cl.
   *C08K 5/15*   (2006.01)
(52) U.S. Cl.
   USPC .................. 524/109; 524/56; 524/57; 524/58
(58) Field of Classification Search
   USPC ........................ 524/109, 56, 57, 58
   See application file for complete search history.

(56) References Cited

U.S. PATENT DOCUMENTS

| | | | |
|---|---|---|---|
| 5,858,620 A | 1/1999 | Ishibashi et al. | |
| 6,579,657 B1 | 6/2003 | Ishibashi et al. | |
| 2006/0188805 A1 | 8/2006 | Nozaki et al. | |
| 2006/0188807 A1 | 8/2006 | Nozaki et al. | |
| 2007/0123623 A1 | 5/2007 | Kozawa et al. | |
| 2009/0226844 A1 | 9/2009 | Nozaki et al. | |

FOREIGN PATENT DOCUMENTS

| | | |
|---|---|---|
| JP | 10-73927 | 3/1998 |
| JP | 2003-84459 | 3/2003 |
| JP | 2005-165096 | 6/2005 |
| JP | 2006-259692 | 9/2006 |
| JP | 2007-114245 | 5/2007 |
| JP | 2007-148272 | 6/2007 |
| JP | 2008-241754 | 10/2008 |

*Primary Examiner* — Edward Cain
(74) *Attorney, Agent, or Firm* — Oblon, Spivak, McClelland, Maier & Neustadt, L.L.P.

(57) ABSTRACT

A resist pattern thickening material containing a resin, a cyclic compound expressed by the general formula 1, at least one of compounds expressed by the general formulae 2 to 3, respectively, and water:

General Formula 1

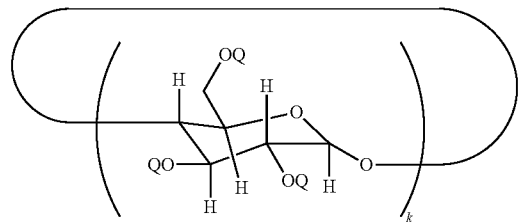

General Formula 2

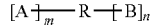

General Formula 3

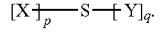

12 Claims, 5 Drawing Sheets

RESIST PATTERN THICKENING MATERIAL, SEMICONDUCTOR DEVICE, AND PRODUCTION METHOD THEREOF

CROSS-REFERENCE TO RELATED APPLICATIONS

This application is based upon and claims the benefits of the priority of the prior Japanese Patent Application No. 2009-252800, filed on Nov. 4, 2009, the entire contents of which are incorporated herein by reference.

FIELD

The embodiments discussed herein relate to a resist pattern thickening material, a semiconductor device produced by using such the material, and a production method of such the device.

BACKGROUND

The formation of fine patterns has been desired for semiconductor devices such as a semiconductor integrated circuit (LIS: Large Scale Integration) along with the improvements in the integration degree, and the minimum pattern has been currently reached the size of 100 nm or smaller.

The formation of such fine patterns in a semiconductor device is realized by an exposure technique using an electron beam capable of forming a fine pattern in the size of 100 nm or smaller. However, the exposure technique using this electron beam has problems such that the through-put thereof is low and it is not suitable for a low-cost mass-production. Therefore, it has been attempted to shorten the wavelength of a light source of an exposure device in the exposure technique without using an electron beam (e.g., an EUV (extreme ultraviolet) exposure using a soft X-ray having a wavelength of 13.5 nm as a light source). However, to shorten the wavelength of the light source of the exposure device, it is necessary to update the exposure device, and thus a significant amount of the cost is expected for the updating. Moreover, to form a fine pattern, an improvement of a resist material is also desired so as to have high resolution corresponded to the properties of the light source of the exposure device. However, the improvement of the resist material has a limitation, and it is extremely difficult to satisfy all the required properties for the resist material. Accordingly, there has been desired to provide a technique capable of accurately forming a uniform and fine resist pattern without updating the exposure device or improving the resist material.

As a method for forming a fine resist pattern, by which the formation of a fine pattern that extends the exposure limit (the resolution limit) of an exposure light source by means of the conventional exposure device, there has been a method that uses a resist pattern thickening material (may also be referred as "a resist swelling agent") configured to thicken a resist pattern so as to be able to form a fine reverse pattern (the space formed between the adjacent resist patterns) from the resulted resist pattern. For example, there has been known a technique (RELACS) for forming a desired fine pattern (e.g., a wiring pattern) having the same shape as a reverse pattern from a resist pattern (see Japanese Patent Application Laid-Open (JP-A) No. 10-73927). In this technique, after forming a KrF resist pattern by exposing a KrF resist film to KrF (krypton fluoride) excimer laser light (a wavelength of 248 nm) that is a deep UV ray, a coating film is formed so as to over the KrF resist pattern, the coating film and the KrF resist pattern are allowed to interact to each other at the contact interface by using a residual acid contained in the KrF resist pattern so as to thicken (swell) the KrF resist pattern to thereby shorten a pitch of the KrF resist pattern. As a result, a fine reverse pattern of the KrF resist pattern is formed.

However, the resist pattern thickening material used for RELACS has a problem such that it does not work on an ArF resist pattern formed by exposing an ArF resist film to ArF (argon fluoride) excimer laser light (a wavelength of 193 nm) that is currently used for a fine processing technique. Moreover, as the resist pattern thickening material thickens a resist pattern by a crosslinking reaction induced by a crosslinking agent contained in the resist pattern thickening material and the residual acid generated in the resist pattern, the thickened amount of the resist pattern varies depending on the size of the original resist pattern before being thickened, and it is very sensitive to the changes in the processing temperature for a wafer. Accordingly, it is difficult to apply such the resist pattern thickening material in the practical use.

As a technique to solve the aforementioned problem, there has been known a technique for forming a fine pattern by using a non-crosslink resist pattern thickening material containing, as an essential substance, a water-soluble aromatic compound such as benzyl alcohol, benzyl amine and derivatives thereof (see JP-A Nos. 2006-259692 and 2007-148272). By using this resist pattern thickening material, it becomes easy to control a reaction as no crosslinking reaction occurs, a resist pattern is thickened without depending on a size of the resist pattern, and it has large tolerance (margin) for the changes in the processing temperature for a wafer. Accordingly, this resist pattern thickening material has been applicable in the practical use.

However, in the case where the processing temperature for a wafer is set high, it has been found out that the water-soluble aromatic compound contained in the non-crosslink resist pattern thickening material is sublimated if a boiling temperature of the water-soluble aromatic compound is lower than the processing temperature. It has been concerned that the sublimated water-soluble aromatic compound be precipitated on an inner wall of a chamber including a hot plate, which is a heating unit, or in an exhaust pipe, then re-deposited on the wafer that is a subject to be processed.

For a material for forming a semiconductor in the form of a coating solution, the defects caused by the re-deposition of sublimates are problems in the production, such as lowing yields or lowing performance of a final product (see, for example, JP-A Nos. 2005-165096 and 2007-114245). Therefore, it is also necessary to avoid the risk for the substances contained in the resist pattern thickening material to be sublimated and re-deposited on a wafer.

SUMMARY

According to an aspect of the invention, a resist pattern thickening material contains a resin, a cyclic compound expressed by the general formula 1, at least one of a compound expressed by the general formula 2 and a compound expressed by the general formula 3, and water.

General Formula 1

In the general formula 1, Q represents at least one of a hydrogen atom, an alkyl group, an acetyl group, and a hydroxyalkyl group; and k represents an integer of 6, 7, or 8.

General Formula 2

In the general formula 2, R represents a cyclic structure; A represents a monovalent organic group containing a carboxyl group; m represents an integer of 1 or larger; B represents at least one of a hydroxyl group, an alkyl group, an alkoxy group, an amino group, an alkyl group-substituted amino group in which a number of the alkyl group is 1 or 2, a carbonyl group, and an alkoxycarbonyl group; and n represents an integer of 0 or larger.

General Formula 3

General Formula 4

In the general formula 3, S represents an aromatic hydrocarbon structure; X represents a compound expressed by the general formula 4; Y represents at least one of a hydroxyl group, an amino group, an alkyl group-substituted amino group in which a number of the alkyl group is 1 or 2, an alkoxy group, an alkoxycarbonyl group, and an alkyl group; p represents an integer of 1 or larger; and q represents an integer of 0 or larger.

In the general formula 4, R1 and R2 are identical to or different from each other, and each represent at least one of a hydrogen atom and a substituent; and Z represents at least one of a hydroxyl group, an amino group, an alkyl group-substituted amino group in which a number of the alkyl group is 1 or 2, and an alkoxy group.

According to another aspect of the invention, a method for producing a semiconductor device contains applying the aforementioned resist pattern thickening material to a resist pattern formed on a processing surface so as to cover a surface of the resist pattern with the resist pattern thickening material to thereby thicken the resist pattern.

According to another aspect of the invention, a semiconductor device contains a base having a processing surface, in which the semiconductor device is produced by the aforementioned method for producing a semiconductor device.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Resist Pattern Thickening Material

The resist pattern thickening material contains at least a resin, a cyclic compound expressed by the general formula 1, at least one of a compound expressed by the general formula 2 and a compound expressed by the general formula 3, and water, and optionally contains other substances.

General Formula 1

In the general formula 1, Q represents at least one of a hydrogen atom, an alkyl group, an acetyl group, and a hydroxyalkyl group; and k represents an integer of 6, 7, or 8.

General Formula 2

In the general formula 2, R represents a cyclic structure; A represents a monovalent organic group containing a carboxyl group; m represents an integer of 1 or larger; B represents at least one of a hydroxyl group, an alkyl group, an alkoxy group, an amino group, an alkyl group-substituted amino group in which a number of the alkyl group is 1 or 2, a carbonyl group, and an alkoxycarbonyl group; and n represents an integer of 0 or larger.

General Formula 3

General Formula 4

In the general formula 3, S represents an aromatic hydrocarbon structure; X represents a compound expressed by the general formula 4; Y represents at least one of a hydroxyl group, an amino group, an alkyl group-substituted amino group in which a number of the alkyl group is 1 or 2, an alkoxy group, an alkoxycarbonyl group, and an alkyl group; p represents an integer of 1 or larger; and q represents an integer of 0 or larger.

In the general formula 4, R1 and R2 are identical to or different from each other, and each represent at least one of a hydrogen atom and a substituent; and Z represents at least one of a hydroxyl group, an amino group, an alkyl group-substituted amino group in which a number of the alkyl group is 1 or 2, and an alkoxy group.

The resist pattern thickening material is water soluble. The water-solubility of the resist pattern thickening material is suitably adjusted depending on the intended purpose without any restriction. For example, the resist pattern thickening material preferably has such water-solubility that 0.1 g or more of the resist pattern thickening material dissolves in 100 g of water having the temperature of 25° C.

The form of the resist pattern thickening material is suitably selected depending on the intended purpose without any restriction. Examples thereof include an aqueous solution, a colloidal solution, and an emulsion. Among them, the aqueous solution is preferable in view of the coatability thereof.

<Resin>

The resin is suitably selected depending on the intended purpose without any restriction. Examples thereof include water-soluble resins.

Examples of the water-soluble resins include polyvinyl alcohol, polyvinyl acetal, polyvinyl acetate, polyacrylic acid, polyvinyl pyrrolidone, polyethylene imine, polyethylene oxide, styrene-maleic acid copolymer, polyvinyl amine, polyalkyl amine, a water-soluble resin containing oxazoline groups, a water-soluble melamine resin, a water-soluble urea resin, an alkyd resin, a sulfone amide resin, cellulose, and tannin. These may be used independently, or in combination.

Among them, polyvinyl alcohol, polyvinyl acetal, polyvinyl acetate, polyvinyl pyrrolidone, cellulose, and tannin are preferable in view of the safety at the time of handling.

The amount of the resin in the resist pattern thickening material is suitably selected depending on the types, amounts, and the like of the cyclic compound expressed by the general formula 1, at least one of the compounds expressed by the general formulae 2 to 3, and the surfactant, without any restriction. The amount of the resin is preferably 0.2 parts by mass to 10 parts by mass, more preferably 0.8 parts by mass to 8 parts by mass, yet more preferably 1 part by mass to 5 parts by mass, with respect to 100 parts by mass of the resist pattern thickening material excluding the cyclic compound expressed by the general formula 1 (the resist pattern thickening material which does not include the cyclic compound expressed by the general formula 1).

When the amount of the resin is less than 0.2 parts by mass, or more than 10 parts by mass with respect to 100 parts by mass of the resist pattern thickening material excluding the cyclic compound expressed by the general formula 1 (the resist pattern thickening material which does not include the cyclic compound expressed by the general formula 1), the resulted resist pattern thickening material may have a problem in the coatability thereof. On the other hand, when the amount of the resin is within the aforementioned yet preferable range, it is advantageous in terms of the coatability thereof.

<Cyclic Compound Expressed by General Formula 1>

The cyclic compound is suitably selected depending on the intended purpose without any restriction, provided that it is expressed by the general formula 1. The cyclic compound expressed by the general formula 1 is a cyclic oligosaccharide compound having such a characteristic as to incorporate (include) another small molecule in a void present inner portion of the cyclic structure thereof.

General Formula 1

In the general formula 1, Q represents at least one of a hydrogen atom, an alkyl group, an acetyl group, and a hydroxyalkyl group; and k represents an integer of 6, 7, or 8.

Specific examples of the cyclic compound expressed by the general formula 1 include cyclodextrins, such as α-cyclodextrin, β-cyclodextrin, γ-cyclodextrin methyl-β-cyclodextrin, monoacetyl-cyclodextrin, 2-hydroxypropyl-β-cyclodextrin, and 2-hydroxyethyl-β-cyclodextrin.

The amount of the cyclic compound expressed by the general formula 1 in the resist pattern thickening material is suitably adjusted depending on the intended purpose without any restriction, but is preferably 5 mol % to 100 mol % relative to an amount of at least one of the compounds expressed by the general formulae 2 to 3 which will be mentioned later. Since the cyclic compound expressed by the general formula 1 is added for making the compound expressed by the general formula 2 or the compound expressed by the general formula 3 be included so as to prevent the sublimation thereof, the amount of the cyclic compound expressed by the general formula 1 added to the resist pattern thickening material is preferably 100 mol % in principle. However, the degree of the obtainable effect differs depending on at least one of the compound expressed by the general formula 2 and the compound expressed by the general formula 3, and thus there may be a case where it is not necessary to add 100 mol % of the cyclic compound expressed by the general formula 1. Therefore, the addition amount of the cyclic compound expressed by the general formula 1 can be suitably adjusted.

<Compound Expressed by General Formula 2, and Compound Expressed by General Formula 3>

The compound is suitably selected depending on the intended purpose without any restriction, provided that as the compound, at least one of a compound expressed by the general formula 2 and a compound expressed by the general formula 3 is selected. The compound is preferably a water-soluble aromatic compound. The water-soluble aromatic compound is suitably selected depending on the intended purpose without any restriction, and examples thereof include phenyl lactic acid, 2-hydroxybenzyl alcohol, and 4-hydroxybenzyl alcohol.

General Formula 2

General Formula 3

In the general formula 2, R is suitably selected depending on the intended purpose without any restriction, provided that it contains a cyclic structure. R is preferably a cyclic structure containing at least one selected from the group consisting of an aromatic hydrocarbon compound, a heterocyclic compound, and an alicyclic compound.

The aromatic hydrocarbon compound is suitably selected depending on the intended purpose without any restriction. The aromatic hydrocarbon compound is preferably an aromatic ring. The aromatic ring is suitably selected depending on the intended purpose without any restriction, and examples thereof include a benzene ring, and a naphthalene ring.

The heterocyclic compound is suitably selected depending on the intended purpose without any restriction, and is preferably pyridine, pyrimidine, or the like.

The alicyclic compound is suitably selected depending on the intended purpose without any restriction, and is preferably a cyclohexyl ring, norbornyl, adamantine, or the like.

In the general formula 2, A is suitably selected depending on the intended purpose without any restriction, provided that it is a monovalent organic group containing a carboxyl group. The monovalent organic group may further contain a hydroxyl group, an alkyl group, an alkoxy group, an amino group, an alkyl group-substituted amino group, a carbonyl group, and an alkoxycarbonyl group, together with the carboxyl group.

Among them, those containing, as well as the carboxyl group, at least two groups selected from a hydroxyl group, an alkyl group, an alkoxy group, an amino group, an alkyl group-substituted amino group, a carbonyl group, and an alkoxycarbonyl group are preferable in view of their water solubility, and those containing, as well as the carboxyl group, a hydroxyl group or an amino group are more preferable.

In the general formula 2, B is suitably selected depending on the intended purpose without any restriction, provided that it is one of a hydroxyl group, an alkyl group, an alkoxy group, an amino group, an alkyl group-substituted amino group in which a number of the alkyl group is 1 or 2, a carbonyl group, and an alkoxycarbonyl group. B is preferably a hydroxyl group or an amino group in view of the water-solubility.

In the general formula 2, m is suitably selected depending on the intended purpose without any restriction, provided that it is an integer of 1 or larger. "m" is preferably 1 as it enables to easily control a reaction by suppressing a crosslinking reaction. In the case where m is an integer of 2 or larger, a plurality of A may be identical to, or different from each other.

In the general formula 2, n is suitably selected depending on the intended purpose without any restriction, provided that it is an integer of 0 or larger. "n" is preferably an integer of 0 to 2 in view of the water-solubility. In the case where n is an integer of 2 or larger, a plurality of B may be identical to, or different from each other.

Specific examples of the compound expressed by the general formula 2 include mandelic acid, phenylalanine, phenylglycine, tylosine, phenyl lactic acid, hydroxyphenylpyruvic acid, hydroxyphenylpropionic acid, hydroxydimethylphenylpropionic acid, amino tetrahydronaphthalene carboxylic acid, amino phenylpropionic acid, phenyl glutamic acid, phenylene dipropionic acid, benzylserine, naphthyl alanine, methylcyclohexane carboxylic acid, amino cyclohexane carboxylic acid, amino biscycloheptane carboxylic acid, and hydroxyadamantane carboxylic acid. These may be used independently, or in combination. Among them, phenyl lactic acid in which A of the general formula 2 contains both a carboxyl group and a hydroxyl group, and phenylalanine and phenylglycine in both of which A of the general formula 2 contains both a carboxyl group and an amino group are preferable as they have high water solubility and a large amount of which can dissolve in water.

In the general formula 3, S is suitably selected depending on the intended purpose without any restriction, provided that it is an aromatic hydrocarbon structure. S is preferably an aromatic ring. The aromatic ring is suitably selected depending on the intended purpose without any restriction, but is preferably a benzene ring, a naphthalene ring, or the like.

In the general formula 3, X is suitably selected depending on the intended purpose without any restriction, provided that it is the one expressed by the general formula 4.

General Formula 4

In the general formula 4, R1 and R2 are identical to or different from each other, and each represent at least one of a hydrogen atom and a substituent; and Z represents at least one of a hydroxyl group, an amino group, an alkyl group-substituted amino group in which a number of the alkyl group is 1 or 2, and an alkoxy group.

In the general formula 4, R1 and R2 are each preferably a hydrogen atom. When R1 and R2 are each a hydrogen atom, it is advantageous in terms of the water solubility.

In the case where R1 and R2 are each the substituent in the general formula 4, the substituent is suitably selected depending on the intended purpose without any restriction. Examples of the substituent include a ketone (alkylcarbonyl) group, an alkoxycarbonyl group, and an alkyl group.

In the general formula 3, Y is suitably selected depending on the intended purpose without any restriction, provided that it is at least one of a hydroxyl group, an amino group, an alkyl group-substituted amino group in which a number of the alkyl group is 1 or 2, an alkoxy group, an alkoxycarbonyl group, and an alkyl group. Y is preferably a hydroxyl group in view of the water solubility.

In the general formula 3, p represents an integer of 1 or larger. In the case where p represents an integer of 2 or larger, a plurality of X may be identical to, or different from each other. In the general formula 3, q represents an integer of 0 or larger. In the case where q represents an integer of 2 or larger, a plurality of Y may be identical to, or different from each other.

Specific examples of the compound expressed by the general formula 3 preferably include a compound having a benzyl alcohol structure, and a compound having a benzyl amine structure.

The compound having the benzyl alcohol structure is suitably selected depending on the intended purpose without any restriction. For example, the compound having the benzyl alcohol structure is preferably selected from benzyl alcohol and derivatives thereof. Specific examples thereof include benzyl alcohol, a hydroxybenzyl alcohol compound such as 2-hydroxybenzyl alcohol (salicyl alcohol) and 4-hydroxybenzyl alcohol, 2-aminobenzyl alcohol, 4-aminobenzyl alcohol, 2,4-dihydroxybenzyl alcohol, 1,4-benzene dimethanol, 1,3-benzene dimethanol, and 1-phenyl-1,2-ethanediol, 4-methoxymethyl phenol.

The compound having the benzyl amine structure is suitably selected depending on the intended purpose without any restriction. For example, the compound having the benzyl amine structure is preferably selected from benzyl amine and derivatives thereof. Specific examples thereof include benzyl amine, and 2-methoxybenzyl amine. These may be used independently, or in combination.

Among them, 2-hydroxybenzyl alcohol and 4-aminobenzyl alcohol are preferable, as they have high water solubility and a large amount of which dissolve in water.

The amount of at least one of the compounds expressed by the general formulae 2 to 3 is suitably adjusted depending on the intended purpose without any restriction. It is preferably 0.01 parts by mass to 50 parts by mass, more preferably 0.1 parts by mass to 10 parts by mass, with respect to 100 parts by mass of the resist pattern thickening material excluding the cyclic compound expressed by the general formula 1 (the resist pattern thickening material which does not contain the cyclic compound expressed by the general formula 1).

When the amount of at least one of the compounds expressed by the general formulae 2 to 3 is less than 0.01 parts by mass with respect to 100 parts by mass of the resist pattern thickening material excluding the cyclic compound expressed by the general formula 1 (the resist pattern thickening material which does not contain the cyclic compound expressed by the general formula 1), the desirable reactivity may not be attained in terms of the thickening effect to the resist pattern. When the amount thereof is more than 50 parts by mass, they may be deposited may be deposited when the resist pattern thickening material is applied, or defects tends to be formed on the resist pattern.

<Water>

The water is suitably selected depending on the intended purpose without any restriction, but is preferably pure water (deionized water).

The amount of the water in the resist pattern thickening material is suitably adjusted depending on the intended purpose without any restriction, but it is preferably 50 parts by mass or more with respect to 100 parts by mass of the resist pattern thickening material excluding the cyclic compound expressed by the general formula 1 (the resist pattern thickening material which does not include the cyclic compound expressed by the general formula 1) in view of the coatability thereof.

<Other Substances>

Other substances are suitably selected depending on the intended purpose without any restriction, provided that they do not adversely affect the obtainable effect of the resist pattern thickening material. Examples of such substances include a surfactant, an organic solvent, and various additives known in the art, such as a quencher including amines, amides, ammonium salts.

The amount of the aforementioned other substances is suitably adjusted depending on the types and amounts of the resin, the cyclic compound expressed by the general formula 1, at least one of the compounds expressed by the general formulae 2 to 3, and the like.

—Surfactant—

The surfactant is suitably selected depending on the intended purpose without any restriction. Examples thereof include a nonionic surfactant, a cationic surfactant, an anionic surfactant, and an amphoteric surfactant. These may be used independently, or in combination. Among them, the nonionic surfactant is preferable as it does not contain a metal ion such as a sodium salt and a potassium salt.

The nonionic surfactant is suitably selected depending on the intended purpose without any restriction. Examples of the nonionic surfactant include alkoxylate surfactants, fatty acid ester surfactants, amide surfactants, alcohol surfactants, and ethylene diamine surfactants. Specific examples of the nonionic surfactant include polyoxyethylene-polyoxyalkylene condensation products (e.g. polyoxyethylene-polyoxypropylene condensation products), polyoxyalkylene alkylethers, polyoxyethylene alkylethers, polyoxyethylene derivatives, sorbitan fatty acid esters, glycerin fatty acid esters, primary alcohol ethoxylates, phenol ethoxylates, nonylphenol ethoxylates, octylphenol ethoxylates, laurylalcohol ethoxylates, oleylalcohol ethoxylates, fatty acid esters, amides, natural alcohols, ethylene diamines, secondary alcohol ethoxylates.

The cationic surfactant is suitably selected depending on the intended purpose without any restriction. Examples thereof include an alkyl cationic surfactant, an amide-based quaternary cationic surfactant, and an ester-based quaternary cationic surfactant.

The anionic surfactant is suitably selected depending on the intended purpose without any restriction. Examples thereof include an alkyl anionic surfactant.

The amphoteric surfactant is suitably selected depending on the intended purpose without any restriction. Examples thereof include an amine oxide-based surfactant, and a betaine-based surfactant.

The amount of the surfactant in the resist pattern thickening material is suitably adjusted depending on the types and amounts of the resin, the cyclic compound expressed by the general formula 1, and at least one of the compounds expressed by the general formulae 2 to 3. It is preferably 2 parts by mass or less with respect to 100 parts by mass of the resist pattern thickening material excluding the cyclic compound expressed by the general formula 1 (the resist pattern thickening material which does not include the cyclic compound expressed by the general formula 1). When the amount of the surfactant is more than 2 parts by mass, the surfactant may be deposited when the resist pattern thickening material is applied, or defects tends to be formed on the resist pattern.

Since the resist pattern thickening material has high compatibility to the resist pattern and exhibits a thickening effect without adding the surfactant therein, the surfactant is not an essential substance and thus no lower limit is set here. However, the particularly preferable amount of the surfactant, at which the aforementioned effects of the surfactant are clearly exhibited, is 0.01 parts by mass to 1 part by mass with respect to 100 parts by mass of the resist pattern thickening material excluding the cyclic compound expressed by the general formula 1 (the resist pattern thickening material which does not include the cyclic compound expressed by the general formula 1).

—Organic Solvent—

The organic solvent is suitably selected depending on the intended purpose without any restriction. Examples of the organic solvent include an alcohol-based organic solvent, a chain ester-based organic solvent, a cyclic ester-based organic solvent, a ketone-based organic solvent, a chain ether-based organic solvent, and a cyclic ether-based organic solvent.

The organic solvent can be used by mixing with water, and suitable examples of such water include pure water (deionized water).

The alcohol-based organic solvent is suitably selected depending on the intended purpose without any restriction. Examples thereof include methanol, ethanol, propyl alcohol, isopropyl alcohol, and butyl alcohol.

The chain ester-based organic solvent is suitably selected depending on the intended purpose without any restriction. Examples thereof include ethyl lactate, and propylene glycol methyl ether acetate (PGMEA).

The cyclic ester-based organic solvent is suitably selected depending on the intended purpose without any restriction. Examples thereof include lactone-based organic solvents such as γ-butyrolactone.

The ketone-based organic solvent is suitably selected depending on the intended purpose without any restriction. Examples thereof include acetone, cyclohexanone, and heptanone.

The chain ether-based organic solvent is suitably selected depending on the intended purpose without any restriction. Examples thereof include ethyleneglycol dimethylether.

The cyclic ether-based organic solvent is suitably selected depending on the intended purpose without any restriction. Examples thereof include tetrahydrofuran, and dioxin.

These organic solvents may be used independently or in combination. Among them, those having the boiling point of about 80° C. to 200° C. are preferable because they enable precise thickening of the resist pattern.

By adding the organic solvent, the solubility of the resin, the cyclic compound expressed by the general formula 1, at least one of the compound expressed by the general formulae 2 to 3, the surfactant and the like to the resist pattern thickening material is improved, and the aseptic effect of the resist pattern thickening material is obtained.

<Use and the Like>

The resist pattern thickening material is used by applying the same onto the resist pattern.

When the resist pattern thickening material is applied, the surfactant may be separately applied to the resist pattern before the resist pattern thickening material is applied, and in this case, the surfactant is not contained in the resist pattern thickening material.

When the resist pattern thickening material is prepared, at least one of the compounds expressed by the general formulae 2 to 3 is included by the cyclic compound expressed by the general formula 1. Then, when the resist pattern thickening material is applied on the resist pattern and is allowed to be interacted (mixed) with the resist pattern, a layer (a mixing layer) formed by interacting the resist pattern thickening material and the resist pattern is formed at the surface portion of the resist pattern.

As a result, the resist pattern is thickened by the amount of the formed mixing layer, and then the thickened resist pattern is formed.

Here, as the resist pattern thickening material contains at least one of the compounds expressed by the general formulae 2 to 3, a desirable and uniform thickening effect is attained regardless of the material, type, or size of the resist pattern, and the thickened amount has less dependency to the material or size of the resist pattern. As at least one of the compounds expressed by the general formulae 2 to 3 is included by the cyclic compound expressed by the general formula 1, the sublimation thereof is inhibited even when baking is performed at the temperature higher than the boiling points of the compounds expressed by the general formulae 2 to 3 after the resist pattern thickening material is applied and the film thereof is formed. Here, it is considered that the portions of the compounds expressed by the general formulae 2 to 3 where contributes to the thickening effect (e.g. a hydroxyl group and the like) are projected from the cyclic compound expressed by the general formula 1.

Moreover, as at least one of the compounds expressed by the general formulae 2 to 3 is included by the cyclic compound expressed by the general formula 1, it is not sublimated at the time of baking after the application of the resist pattern thickening material.

A diameter or pitch of the reverse pattern formed using the thickened resist pattern formed in this manner becomes smaller than a diameter or pitch of the reverse pattern formed using the original resist pattern without thickening. Therefore, a finer reverse pattern is formed by exceeding the exposure limit (the resolution limit) of a light source (smaller than the size limitation of the opening and/or pitch which the wavelength of the light used for the light source can pattern) of an exposure device used for the patterning of the resist pattern. Namely, when the resist pattern obtained by using ArF excimer laser light at the time of the patterning is thickened with the resist pattern thickening material, the reverse pattern obtained from the thickened resist pattern is so minute and highly precise as if it is patterned by an electron beam, and a highly precise pattern is formed without any risk.

Note that, the thickened amount of the resist pattern is controlled within the desirable range by suitably controlling the viscosity, applied thickness, baking temperature, baking duration, or the like of the resist pattern thickening material.

The resist pattern thickening material is to be applied to the resist pattern which is formed and exposed in advance. The coatability thereof is relied on the composition of the resin, at least one of the compounds expressed by the general formulae 2 to 3, and the surfactant. Even when the cyclic compound expressed by the general formula 1 is added thereto, it does not adversely affect the basic performance of the composition. Moreover, as a result of the addition of the cyclic compound expressed by the general formula 1, the sublimation of at least one of the compounds expressed by the general formulae 2 to 3, which has been a conventional problem in terms of the material, is suppressed by utilizing the inclusion effect of the cyclic compound expressed by the general formula 1, while maintaining a sufficient thickening effect to the resist pattern.

—Materials for a Resist Pattern—

The materials for the resist pattern (the resist pattern to which the resist pattern thickening material is applied) are suitably selected from the conventional resist materials without any restriction, and may be negative, or positive. Examples thereof include those can be patterned by g-line, i-line, KrF excimer laser light, ArF excimer laser light, $F_2$ excimer laser light, an electron beam and the like, such as a g-line resist, an i-line resist, a KrF resist, an ArF resist, a $F_2$ resist, an electron beam resist, and the like. There may be of chemically amplified, or of chemically non-amplified. Among them, a KrF resist, an ArF resist, a resist containing an acrylic resin are preferable, at least one of the ArF resist the extension of the resolution limit of which has been urgently desired and the resist containing an acrylic resin is more preferable in view of the finer patterning, and the improvement of through-put.

Specific examples of the materials for the resist pattern include a novolak-based resist, a PHS-based resist, an acryl-based resist, a cycloolefin-maleic acid anhydride(COMA)-based resist, a cycloolefin-based resist, and a hybrid (alicyclic acryl-COMA copolymer) resist. These may be fluorine-modified, or has other modification.

The formation method, size, thickness, and the like of the resist pattern are suitably selected without any restriction. Especially, the thickness of the resist pattern is suitably adjusted depending on the processing surface which is a subject for the process, the etching conditions, and the like, but is generally approximately 100 nm to approximately 500 nm.

Hereinafter, the thickening of the resist pattern using the resist pattern thickening material will be explained with reference to the drawings.

Figure 1:
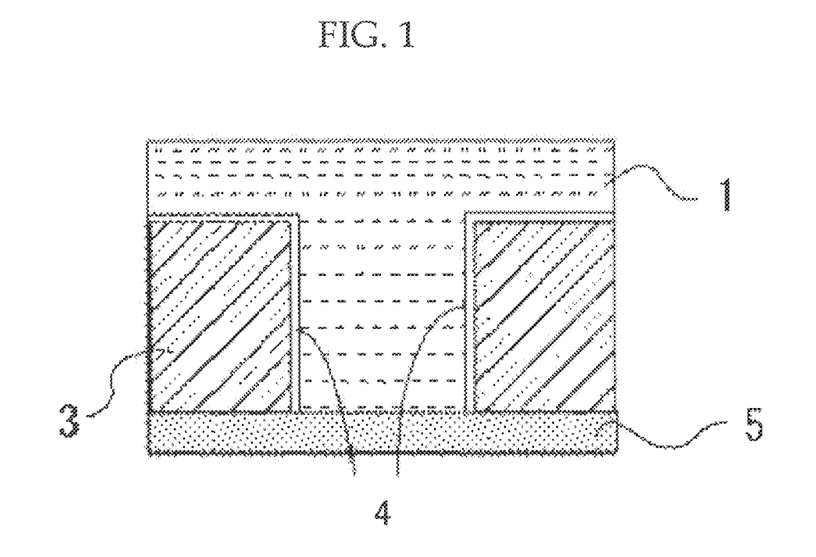
FIG. 1 is a diagram which explains a mechanism for thickening a resist pattern using the disclosed resist pattern thickening material, and illustrates a state where the resist pattern thickening material is applied to a surface of the resist pattern.
Figure 2:
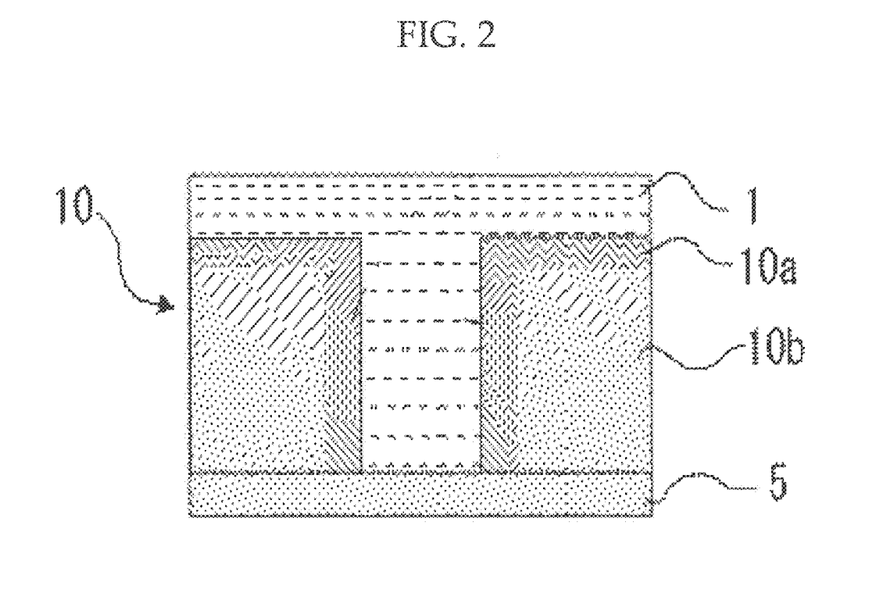
FIG. 2 is a diagram which explains the mechanism for thickening the resist pattern using the disclosed resist pattern thickening material, and illustrates a state where the resist pattern thickening material penetrates into the surface of the resist pattern.

As illustrated in FIG. 1, after forming a resist pattern 3 on a processing surface (of a base 5), a resist pattern thickening material 1 is applied (coated) to a surface of the resist pattern 3, followed by baking (heating and drying) to thereby form a coated film. Then, the resist pattern thickening material 1 is mixed (penetrated) into the resist pattern 3 at an interface between the resist pattern 3 and the resist pattern thickening material 1. As a result, as illustrated in FIG. 2, the portion which has been mixed (penetrated) is reacted at an interface between an inner layer of the resist pattern 10b (the resist pattern 3) and the resist pattern thickening material 1 to thereby form a surface layer (a mixing layer) 10a. At this time, as the resist pattern thickening material 1 contains at least one of the compounds expressed by the general formulae 2 to 3, the inner layer of the resist pattern 10b (the resist pattern 3) is stably and uniformly thickened regardless of (without depending on) the size of the inner layer of the resist pattern 10b (the resist pattern 3).

Figure 3:
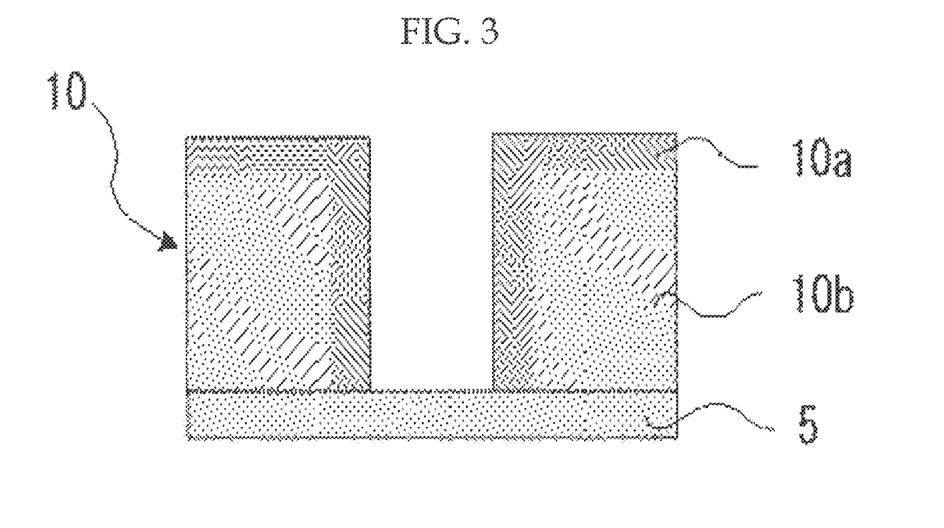
FIG. 3 is a diagram which explains the mechanism for thickening the resist pattern using the disclosed resist pattern thickening material, and illustrates a state where the surface portion of the resist pattern is thickened with the resist pattern thickening material.

Thereafter, as illustrated in FIG. 3, within the applied (coated) resist pattern thickening material 1, the portion where the resist pattern thickening material 1 has not been interacted (mixed) with the resist pattern 3 and/or the portion where the interaction between the resist pattern thickening material 1 and the resist pattern 3 (the portion having high water solubility) is weak are dissolved and removed by performing a developing to thereby form (develop) a thickened resist pattern 10 which is uniformly thickened.

Note that, the developing may be a water developing or a developing using an alkali developer. The developer, e.g. water, and the alkali developer, can optionally contain a surfactant, and the details thereof will be described later.

The thickened resist pattern 10 has the inner layer of the resist pattern 10b (the resist pattern 3), and the surface layer (the mixing layer) 10a formed on the surface of the inner layer of the resist pattern 10b (the resist pattern 3) by being reacted with the resist pattern thickening material 1. As the thickened resist pattern 10 is thickened by the thickness of the surface layer (the mixing layer) 10a compared with the resist pattern 3, the size of the reverse pattern formed by the thickened resist pattern 10 (the pitch between the adjacent thickened resist patterns 10, or the opening diameter of a hole pattern formed by the thickened resist pattern 10) is smaller than the size of the reverse pattern formed by the resist pattern 3. Therefore, a fine reverse pattern can be formed by extending the exposure limit (the resolution limit) of the light source of the exposure device used for forming the resist pattern 3. Namely, even though exposure is performed by using ArF excimer laser light, a fine reverse pattern is formed as if exposure is formed by using an electron beam. The reverse pattern formed by the thickened resist pattern 10 is minuter and more precise than the reverse pattern formed by the resist pattern 3.

The surface layer (the mixing layer) 10a of the thickened resist pattern 10 is formed of the resist pattern thickening material 1. As the resist pattern thickening material 1 contains at least one of the compounds expressed by the general formulae 2 to 3, even though the resist pattern 3 (the inner layer of the resist pattern 10b) is formed of the material which has poor etching resistance, the resulted thickened resist pattern 10 has the desirable etching resistance.

The resist pattern thickening material is suitably used for thickening the resist pattern to thereby form a finer reverse pattern by extending the exposure limit. Moreover, the resist pattern thickening material is especially suitably used for the method for producing a semiconductor mentioned later.

—Formation Method of a Resist Pattern—

The formation method of the resist pattern contains applying the resist pattern thickening material to the previously formed resist pattern so as to cover a surface of the resist pattern, preferably further contains, before applying the resist pattern thickening material, exposing the entire surface of the resist pattern to a UV-ray or an ionizing radiation, and optionally further contains suitably selected other processes.

The materials for the resist pattern are preferable those mentioned in the resist pattern thickening material above.

The resist pattern can be formed in accordance with the methods known in the art.

The resist pattern can be formed on a processing surface (of a base), and the processing surface (of the base) is suitably selected depending on the intended purpose without any restriction. In the case where the resist pattern is formed in the course of the production of a semiconductor device, examples of the processing surface (of the base) include a surface of a semiconductor substrate. Specific examples thereof include a substrate such as a silicon wafer, and various oxide films.

The method for applying the resist pattern thickening material is suitably selected from the coating methods known depending on the intended purpose in the art without any restriction. For example, a spin coating is preferable. In the case of the spin coating, as the conditions thereof, for example, the revolution speed is approximately 100 rpm to approximately 10,000 rpm, preferably 800 rpm to 5,000 rpm, and the duration is approximately 1 second to approximately 10 minutes, preferably 1 second to 90 seconds.

At the time of the application, the applied thickness is generally approximately 10 nm to approximately 1,000 nm, preferably approximately 50 nm to approximately 300 nm.

Note that, at the time of the application, the surfactant may be separately applied to the resist pattern before the application of the resist pattern thickening material, without adding the surfactant to the resist pattern thickening material.

It is preferred that before the application of the resist pattern thickening material, the entire surface of the resist pattern is optionally exposed to an UV-ray or an ionizing radiation (hereinafter, may be referred to as "pre-exposure treatment") for the purpose of making the surface condition of the resist pattern even within the wafer surface. When the resist pattern thickening material is applied after the pre-exposure treatment, the difference in the thickened amount caused due to the difference in the pattern density is reduced, and the resist pattern of the predetermined size can be stably and efficiently obtained. Specifically, when the resist pattern having various pitches including the region where the resist pattern is spaced (the region where the resist pattern has a long pitch) and the region where the resist pattern is dense (the region where the resist pattern has a short pitch), or the resist pattern having various sizes of convex portions is thickened, there has been a problem such that the thickened amount differs depending on the difference in the density or size. This is because each convex portion of the resist pattern has the light intensity distribution at the time of the exposure, and the slight difference of the surface conditions (the difference in the fogging exposure value) in such a degree that will not be noticed by the developing of the resist pattern will affect the formation of the mixing layer formed by the interaction between the resist pattern and the resist pattern thickening material in terms of the easiness for the formation. When the entire surface of the resist pattern is exposed to the UV-ray or the ionizing radiation before the application of the resist pattern thickening material, the surface conditions of the resist pattern are unified, and thus the thickened amount of the resist pattern can be unified without depending on the density or size of the resist pattern.

The UV-ray and the ionizing radiation are suitably selected depending on the sensitive wavelength range of the materials for the resist pattern without any restriction. Specific examples thereof include a broad band UV-ray emitted from a high pressure mercury lamp or low pressure mercury lamp, g-line (a wavelength of 436 nm), i-line (a wavelength of 365 nm), KrF excimer laser light (a wavelength of 248 nm), ArF excimer laser light (a wavelength of 193 nm), $F_2$ excimer laser light (a wavelength of 157 nm), EUV-ray (a soft X-ray region of a wavelength of 5 nm to 15 nm), an electron beam, and X-ray. Note that, among them, the one that is the same as the UV-ray or the ionizing radiation used for the exposure for forming the resist pattern is preferable in view of the structure of the production device.

The irradiance (the exposure dose) of the UV-ray or the ionizing radiation to the resist pattern is suitably selected depending on the type of the UV-ray or the ionizing radiation for use without any restriction. For example, it is preferably 0.1% to 20% relative to the irradiance (the exposure dose) for the formation of the resist pattern.

When the irradiance is less than 0.1%, the surface conditions of the resist pattern may not be unified sufficiently. When the irradiance is more than 20%, the photoreaction is excessively induced in the resist pattern, and thus the upper portion of the resist pattern may be degraded in terms of the shape thereof, or the pattern may be partially lost.

The method for the exposure is not particularly restricted provided that the UV-ray or the ionizing radiation is applied at the constant irradiance mentioned earlier. It is suitably adjusted and carried out in such a manner that the exposure of the strong light is carried out in a short period, the exposure of the weak light is carried out in a long period, the exposure to the highly sensitive resist material is carried out at the low exposure dose (irradiance), or the exposure to the resist material having low sensitivity is carried out at the high exposure dose (irradiance).

Moreover, a pre-baking (heating and drying) may be performed on the applied resist pattern thickening material during and/or after the application of the resist pattern thickening material so that the mixing (penetrating) of the resist pattern thickening material to the resist pattern is efficiently induced at an interface between the resist pattern and the resist pattern thickening material.

Note that, the condition, method, and the like of the pre-baking (heating and drying) are suitably selected depending on the intended purpose without any restriction, provided that the resist pattern is not softened thereby. The number for performing the pre-baking may be once, or two or more times. In the case where the pre-baking is performed two or more times, the temperature of the pre-baking may be constant or different each time. In the case where the temperature is constant, the temperature is preferably approximately 40° C. to approximately 150° C., more preferably 60° C. to 120° C., and the duration is preferably approximately 10 seconds to approximately 5 minutes, more preferably 40 seconds to 100 seconds.

Moreover, it is preferred that a reaction-baking for accelerating the reaction of the applied resist pattern thickening material be optionally performed after the pre-baking (heating and drying) as it enables to efficiently accelerate the progress of the reaction of the mixed (penetrated) portion at the interface between the resist pattern and the resist pattern thickening material.

Note that, the condition, method, and the like of the reaction-baking are suitably selected depending on the intended purpose without any restriction, but the reaction-baking is generally performed at the temperature higher than that of the pre-baking (heating and drying). As for the conditions of the reaction-baking, for example, the temperature is approximately 60° C. to approximately 150° C., preferably 70° C. to 130° C., and the duration is approximately 10 seconds to approximately 5 minutes, preferably 40 seconds to 100 seconds.

Furthermore, it is preferred that the applied resist pattern thickening material be developed after the reaction-baking. In this case, within the applied resist pattern thickening material, the portion where the resist pattern thickening material is not interacted (mixed) nor reacted with the resist pattern, and the portion where the interaction (mixing) between the resist pattern thickening material and the resist pattern is weak are dissolved and removed to thereby develop (obtain) the thickened resist pattern. Therefore, such the developing is preferable.

The developing is suitably selected depending on the intended purpose without any restriction, and may be a water developing or an alkali developing. It is preferred that the developer such as water and an alkali developer contain a surfactant. In the case where the surfactant is added to the developer, uniformity of the thickened effect at the interface between the resist pattern thickening material and the resist pattern is improved within the processing surface, and the generation of residual substances or defects can be reduced.

The surfactant is suitably selected depending on the intended purpose without any restriction. The nonionic surfactant is preferable as it does not contain a metal ion such as a sodium salt and a potassium salt.

The nonionic surfactant is suitably selected depending on the intended purpose without any restriction. Specific examples of the nonionic surfactant include polyoxyethylene-polyoxypropylene condensation products, polyoxyalkylene alkylethers, polyoxyethylene alkylethers, polyoxyethylene derivatives, silicone compounds, sorbitan fatty acid esters, glycerin fatty acid esters, alcohol ethoxylates, and phenol ethoxylates. These may be used independently, or in combination. Note that, as the surfactant, the ionic surfactant can be used, provided that it is a non-metal salt-based.

The amount of the surfactant in water (a developer) is suitably adjusted depending on the intended purpose without any restriction, but is preferably 0.001% by mass to 1% by mass, more preferably 0.05% by mass to 0.5% by mass.

When the amount of the surfactant is less than 0.001% by mass, the effect of the surfactant is not sufficiently exhibited. When the amount thereof is more than 1% by mass, the solvency of the developer becomes excessive, and thus it influences on the shape of the resist pattern and the reduction amount of the reverse pattern, such that the pitch of the resist pattern may be widened, or the edge of the resist pattern may be rounded, as well as generating the residual substances or defects due to the formation of bubbles.

The alkali developer is suitably selected from those conventionally used for the production of a semiconductor device, without any restriction. Preferable examples thereof include a quaternary ammonium hydroxide aqueous solution, and a choline aqueous solution. These may be used independently or in combination. Among them, a tetramethylammonium hydroxide aqueous solution is preferable as it is inexpensive and versatile.

Moreover, to the alkali developer, a surfactant may be optionally added. In this case, the amount of the surfactant in the alkali developing solution is suitably adjusted depending on the intended purpose without any restriction. The amount thereof is the same as the above, preferably 0.001% by mass to 1% by mass, more preferably 0.05% by mass to 0.5% by mass.

The disclosed resist pattern thickening material is capable of forming a fine resist pattern, which extends the exposure limit of a light source of the conventional exposure device, by efficiently thickening the resist pattern, while suppressing the sublimation of the low molecular compound.

(Semiconductor Device and Method for Producing the Same)

The method for producing a semiconductor device contains a resist pattern forming step, preferably further contains a patterning step, and optionally further contains other suitably selected steps.

The resist pattern forming step is applying the resist pattern thickening material to a resist pattern formed on a processing surface so as to cover a surface of the resist pattern to thereby thicken the resist pattern. As a result of the resist pattern forming step, the thickened resist pattern is formed on the processing surface.

The details of the resist pattern forming step are the same as those described in the formation method of the resist pattern.

Examples of the processing surface include surface layers of various members in a semiconductor device, but a substrate such as a silicon wafer and/or a surface thereof, and various oxide films are preferable. The resist pattern is as mentioned earlier. The method of the application is also as mentioned earlier. Moreover, it is preferred that the aforementioned pre-baking, reaction-baking, and the like be performed after the application of the resist pattern thickening material.

The patterning step is etching the processing surface by using the thickened resist pattern formed in the resist pattern forming step as a mask (as a mask pattern) so as to pattern the processing surface.

The method for etching is suitably selected from the methods known in the art depending on the intended purpose without any restriction. For example, a dry etching is preferable. The conditions for etching are suitably selected depending on the intended purpose without any restriction.

As the aforementioned other steps, for example, a surfactant applying step, a developing step, and the like are preferable.

The surfactant applying step is applying the surfactant to the surface of the resist pattern before the resist pattern forming step.

The surfactant is suitably selected depending on the intended purpose without any restriction. For example, those mentioned earlier are preferable. Examples thereof include polyoxyethylene-polyoxypropylene condensation products, polyoxyalkylene alkylethers, polyoxyethylene alkylethers, polyoxyethylene derivatives, sorbitan fatty acid esters, glycerin fatty acid esters, primary alcohol ethoxylates, phenol ethoxylates, nonylphenol ethoxylates, octylphenol ethoxylates, laurylalcohol ethoxylates, oleylalcohol ethoxylates, fatty acid esters, amides, natural alcohols, ethylene diamines, secondary alcohol ethoxylates, alkyl cations, amide-based quaternary cations, ester-based quaternary cations, amine oxides, and betaines.

The developing step is developing the applied resist pattern thickening material after the resist pattern forming step, but before the patterning step. Note that, the developing is as mentioned earlier.

According to the method for producing a semiconductor device, various semiconductor devices, such as a flash memory, DRAM, and FRAM, are efficiently produced.

According to the method for producing a semiconductor device, a fine resist pattern can be formed by extending the exposure limit of the light source of the conventional exposure device, and a high-performance semiconductor device having a fine wiring pattern formed by using the resist fine pattern can be efficiently mass-produced.

According to the semiconductor device, as it has a fine wiring pattern, the semiconductor device of higher performance can be attained.

EXAMPLES

Hereinafter, the examples of the present invention will be specifically explained, but these examples shall not be construed as to limit the scope of the present invention.

Example 1

Preparation of the Resist Pattern Thickening Material

The resist pattern thickening materials A to Q each having the formulation depicted in Table 1 were prepared.

Note that, in Table 1, "a thickening material" means a resist pattern thickening material; and "A" to "Q" are corresponded to the resist pattern thickening materials A to Q. Among the resist pattern thickening materials A to Q, the resist pattern thickening materials A, B, P and Q are comparative examples, and the resist pattern thickening materials C to O are examples (the embodiments of the invention). In Table 1, the unit for the value written in the parenthesis represents "mass (g)".

The cyclodextrin compound of any of the resist pattern thickening materials C to O in the columns of "Compound expressed by general formula 1" is the cyclic compound expressed by the general formula 1. The cyclic compound expressed by the general formula 1 was added to each resist pattern thickening material in an amount of 100 mol % relative to the amount of at least one of the compounds expressed by the general formulae 2 to 3. Note that, the added amount thereof was determined based on the molecular weight of each compound: α-cyclodextrin (972.84), β-cyclodextrin (1,134.98), γ-cyclodextrin (1,297.12), 2-hydroxypropyl-β-cyclodextrin (1,400), 2-hydroxyethyl-β-cyclodextrin (1,350), methyl-β-cyclodextrin (1,300), and monoacetyl-β-cyclodextrin (1,400).

Moreover, in the columns of "At least one of compounds expressed by general formulae 2 to 3", "2HBA" denotes 2-hydroxybenzyl alcohol, "4HBA" denotes 4-hydroxybenzyl alcohol, and "PLA" denotes phenyl lactic acid.

Furthermore, in the columns of "Resin", "PVA" denotes a polyvinyl alcohol resin (PVA-205C manufactured by Kuraray Co., Ltd.). In the columns of "Surfactant", "PC-6" denotes a nonionic surfactant (a multinuclear phenol-based surfactant, manufactured by ADEKA CORPORATION), and "TN-80" denotes a nonionic surfactant (a primary alcohol ethoxylate-based surfactant, manufactured by ADEKA CORPORATION).

Moreover, as a solvent, pure water (deionized water) was used and the amount thereof was 100 (g) relative to each formulation.

Moreover, α-cyclodextrin was the one manufactured by TOKYO CHEMICAL INDUSTRY CO., LTD., β-cyclodextrin was the one manufactured by TOKYO CHEMICAL INDUSTRY CO., LTD., γ-cyclodextrin was the one manufactured by TOKYO CHEMICAL INDUSTRY CO., LTD., 2-hydroxypropyl-β-cyclodextrin was the one manufactured by Wako Pure Chemical Industries, Ltd., 2-hydroxyethyl-β-cyclodextrin was the one manufactured by Wako Pure Chemical Industries, Ltd., methyl-β-cyclodextrin was the one manufactured by Wako Pure Chemical Industries, Ltd., and monoacetyl-β-cyclodextrin was the one manufactured by JUNSEI CHEMICAL CO., LTD.

TABLE 1

| Thickening material | Resin | Compound expressed by general formula 1 | At least one of compounds expressed by general formulae 2 to 3 | Surfactant |
| --- | --- | --- | --- | --- |
| A | PVA(4) | — | 2HBA(1) | PC-6(0.06) |
| B | PVA(4) | — | 2HBA(1) | TN-80(0.06) |
| C | PVA(4) | α-cyclodextrin | 2HBA(1) | PC-6(0.06) |
| D | PVA(4) | β-cyclodextrin | 2HBA(1) | PC-6(0.06) |
| E | PVA(4) | γ-cyclodextrin | 2HBA(1) | PC-6(0.06) |
| F | PVA(4) | 2-hydroxypropyl-β-cyclodextrin | 2HBA(1) | PC-6(0.06) |
| G | PVA(4) | 2-hydroxypropyl-β-cyclodextrin | 2HBA(1) | TN-80(0.06) |
| H | PVA(4) | methyl-β-cyclodextrin | 2HBA(1) | TN-80(0.06) |
| I | PVA(4) | α-cyclodextrin | 4HBA(1) | PC-6(0.06) |
| J | PVA(4) | α-cyclodextrin | PLA(1) | PC-6(0.06) |
| K | PVA(4) | methyl-β-cyclodextrin | 2HBA(1) | PC-6(0.06) |
| L | PVA(4) | monoacetyl-β-cyclodextrin | 2HBA(1) | TN-80(0.06) |
| M | PVA(4) | 2-hydroxypropyl-β-cyclodextrin | PLA(1) | TN-80(0.06) |
| N | PVA(4) | 2-hydroxyethyl-β-cyclodextrin | 2HBA(1) | TN-80(0.06) |
| O | PVA(4) | 2-hydroxyethyl-β-cyclodextrin | 2HBA(1) | PC-6(0.06) |
| P | PVA(4) | — | — | PC-6(0.06) |
| Q | PVA(4) | — | — | TN-80(0.06) |

—Determination of Sublimability—

The resist pattern thickening materials A to Q prepared as above were each applied onto a 1-inch wafer by spin coating at the condition of 850 rpm/5 s initially, and then at the condition of 3,500 rpm/20 s to thereby prepare measurement samples. Next, a crystal oscillator was set in a measurement holder in a QCM device (RQCM, manufactured by Maxtek), the wafer onto which the resist pattern thickening material was applied was placed on a hot plate at the temperature of 110° C., and at the same time, the wafer was covered with the holder to thereby perform a measurement during the baking for 60 seconds.

At this time, the sublimate generated from the resist pattern thickening material applied onto the wafer was deposited on the crystal oscillator placed in the holder which covered the wafer, and the change in the weight was measured and determined as the sublimated amount from the resist pattern thickening material. The results are shown in Table 2. The sublimated amount was the amount (μg) sublimated per inch of the wafer. Note that, in Table 2, "A" to "Q" are corresponded to the resist pattern thickening materials A to Q.

TABLE 2

|   | Sublimated amount (μg) |
| --- | --- |
| A | 2.0 |
| B | 1.4 |
| C | 0 |
| D | 0 |
| E | 0 |
| F | 0 |
| G | 0 |
| H | 0 |
| I | 0 |
| J | 0 |
| K | 0 |
| L | 0 |
| M | 0 |
| N | 0 |
| O | 0 |
| P | 0 |
| Q | 0 |

From the results depicted in Table 2, it was found that the resist pattern thickening materials C to O each containing the cyclic compound expressed by the general formula 1 had the effect for preventing the conventional materials (A and B) from being sublimated during the baking.

—Formation of a Resist Pattern—

Each of the above-prepared resist pattern thickening materials A to Q was applied on a hole pattern (having an opening diameter depicted in Table 3 as "Initial pattern size") formed in an alicyclic ArF resist (EPIC2380, manufactured by Rohm and Haas Company) by spin coating at the condition of 850 rpm/5 s initially, then at the condition of 3,500 rpm/20 s, followed by baking at the condition of 110° C./60 s. Thereafter, the thickened resist pattern with each of the resist pattern thickening materials A to Q was developed by rinsing each of the resist pattern thickening materials A to Q with pure water for 60 seconds and then removing the unreacted portion which had no interaction (mixing), to thereby form a thickened resist pattern.

The reduced amount of the reverse pattern formed by each of the obtained thickened resist patterns ("Thickened amount" in Table 3) is depicted in Table 3. Note that, in Table 3, "A" to "Q" are corresponded to the resist pattern thickening materials A to Q.

TABLE 3

| | Initial pattern size (nm) | Thickened amount (nm) |
|---|---|---|
| A | 81.0 | 13.2 |
| B | 80.4 | 18.2 |
| C | 81.5 | 11.0 |
| D | 80.7 | 10.7 |
| E | 81.0 | 11.0 |
| F | 82.2 | 12.4 |
| G | 81.6 | 14.6 |
| H | 81.4 | 14.4 |
| I | 80.6 | 11.1 |
| J | 81.5 | 10.6 |
| K | 81.5 | 14.5 |
| L | 80.8 | 14.0 |
| M | 81.0 | 12.0 |
| N | 80.8 | 10.1 |
| O | 81.2 | 13.2 |
| P | 80.8 | 5.2 |
| Q | 80.6 | 3.4 |

From the results of Table 3, it was found that the resist pattern thickening materials C to O each containing the cyclic compound expressed by the general formula 1 had the thickening effect similar to that of the conventional resist pattern thickening materials (A and B) without containing the cyclic compound expressed by the general formula 1.

Moreover, it was also found that the resist pattern thickening materials (P and Q) which did not contain at least one of the compounds expressed by the general formulae 2 to 3 did not attain sufficient thickening effects.

Next, a resist pattern thickening material in which the added amount of α-cyclodextrin as the cyclic compound expressed by the general formula 1 was changed from the resist pattern thickening material C was prepared. The resist pattern thickening material C contained 100 mol % of α-cyclodextrin relative to the amount of 2-hydroxybenzyl alcohol added as at least one of the compounds expressed by the general formulae 2 to 3. Here, the resist pattern thickening materials each containing 50 mol % of α-cyclodextrin, and 25 mol % of α-cyclodextrin were prepared. The thickened amount and sublimated amount of the resist pattern thickening material C, the above-prepared resist pattern thickening materials, and the resist pattern thickening material containing no α-cyclodextrin (0 mol % of α-cyclodextrin, i.e. the resist pattern thickening material A) are depicted in Table 4.

TABLE 4

| Added amount of α-cyclodextrin (mol %) | Thickened amount (nm) | Sublimated ($\mu g/cm^2$) |
|---|---|---|
| 0 | 13.2 | 2.0 |
| 25 | 9.0 | 1.0 |
| 50 | 10.2 | 0.4 |
| 100 | 11.0 | 0.0 |

From the results of Table 4, it was found that the sublimated amount of 2-hydroxybenzyl alcohol was decreased as the added amount of α-cyclodextrin as the cyclic compound expressed by the general formula 1 was increased, and α-cyclodextrin prevented 2-hydroxybenzyl alcohol from being sublimated out of the resist pattern thickening material while sufficiently maintaining the thickening effect to the resist pattern, though there were slight changes in the thickened amount.

A resist pattern thickening material in which the added amount of 2-hydroxypropyl-β-cyclodextrin as the cyclic compound expressed by the general formula 1 was changed from the resist pattern thickening material G was prepared. The resist pattern thickening material G contained 100 mol % of 2-hydroxypropyl-β-cyclodextrin relative to the amount of 2-hydroxybenzyl alcohol added as at least one of the compounds expressed by the general formulae 2 to 3. Here, the resist pattern thickening materials each containing 50 mol % of 2-hydroxypropyl-β-cyclodextrin, and 25 mol % of 2-hydroxypropyl-β-cyclodextrin were prepared. The thickened amount and sublimated amount of the resist pattern thickening material G, the above-prepared resist pattern thickening materials, and the resist pattern thickening material containing no 2-hydroxypropyl-β-cyclodextrin (0 mol % of 2-hydroxypropyl-β-cyclodextrin, i.e. the resist pattern thickening material B) are depicted in Table 5.

TABLE 5

| Added amount of 2-hydroxypropyl-β-cyclodextrin (mol %) | Thickened amount (nm) | Sublimated amount ($\mu g/cm^2$) |
|---|---|---|
| 0 | 18.2 | 1.4 |
| 25 | 13.6 | 0.8 |
| 50 | 12.9 | 0.4 |
| 100 | 14.6 | 0.0 |

From the results of Table 5, it was found that the sublimated amount of 2-hydroxybenzyl alcohol was decreased as the added amount of 2-hydroxypropyl-β-cyclodextrin as the cyclic compound expressed by the general formula 1 was increased, and 2-hydroxypropyl-β-cyclodextrin prevented 2-hydroxybenzyl alcohol from being sublimated out of the resist pattern thickening material while sufficiently maintaining the thickening effect to the resist pattern, though there were slight changes in the thickened amount.

A resist pattern thickening material in which the added amount of methyl-β-cyclodextrin as the cyclic compound expressed by the general formula 1 was changed from the resist pattern thickening material H was prepared. The resist pattern thickening material H contained 100 mol % of methyl-β-cyclodextrin relative to the amount of 2-hydroxybenzyl alcohol added as at least one of the compounds expressed by the general formulae 2 to 3. Here, the resist pattern thickening materials each containing 50 mol % of methyl-β-cyclodextrin, and 25 mol % of methyl-β-cyclodextrin were prepared. The thickened amount and sublimated amount of the resist pattern thickening material H, the above-prepared resist pattern thickening materials, and the resist pattern thickening material containing no methyl-β-cyclodextrin (0 mol % of methyl-β-cyclodextrin, i.e. the resist pattern thickening material B) are depicted in Table 6.

TABLE 6

| Added amount of methyl-β-cyclodextrin (mol %) | Thickened amount (nm) | Sublimated amount ($\mu g/cm^2$) |
|---|---|---|
| 0 | 18.2 | 1.4 |
| 25 | 13.6 | 0.0 |
| 50 | 13.6 | 0.0 |
| 100 | 14.4 | 0.0 |

From the results of Table 6, it was found that the sublimated amount of 2-hydroxybenzyl alcohol was decreased as the added amount of methyl-β-cyclodextrin as the cyclic compound expressed by the general formula 1 was increased, and methyl-β-cyclodextrin prevented 2-hydroxybenzyl alcohol from sublimated out of the resist pattern thickening material while sufficiently maintaining the thickening effect to the resist pattern, though there were slight changes in the thickened amount.

Example 2

Production of a Semiconductor Device

Figure 4A:
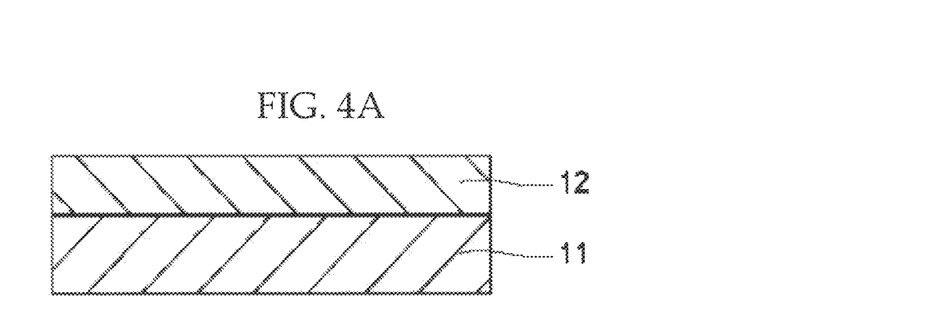
FIG. 4A is a schematic diagram for explaining an example of the disclosed method for producing a semiconductor, and illustrating a state where an interlayer insulating film is formed on a silicon substrate.
Figure 4B:
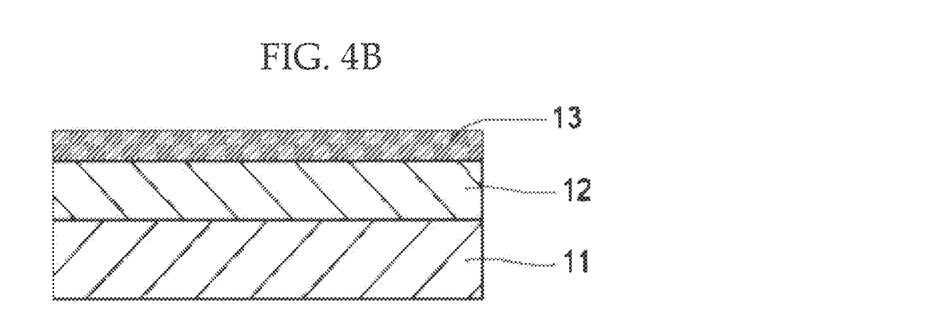
FIG. 4B is a schematic diagram for explaining the example of the disclosed method for producing a semiconductor, and illustrating a state where a titanium layer is formed on the interlayer insulating film illustrated in FIG. 4A.
Figure 4C:
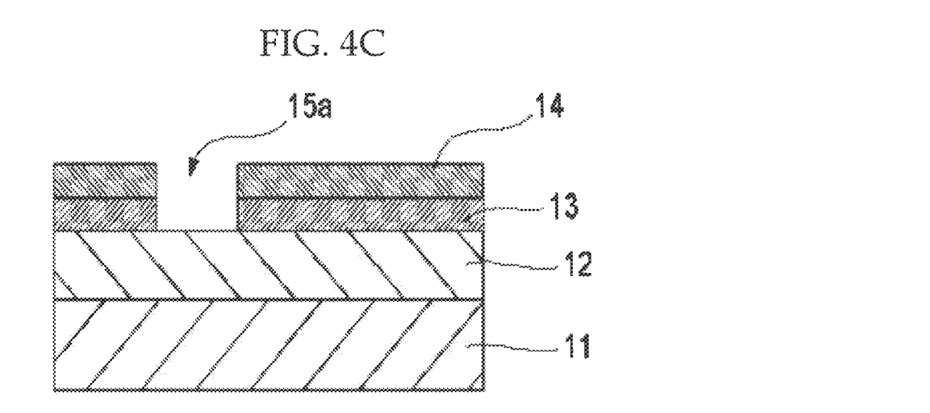
FIG. 4C is a schematic diagram for explaining the example of the disclosed method for producing a semiconductor, and illustrating a state where a resist pattern is formed on the titanium layer, and a hole pattern is formed in the titanium layer.
Figure 4D:
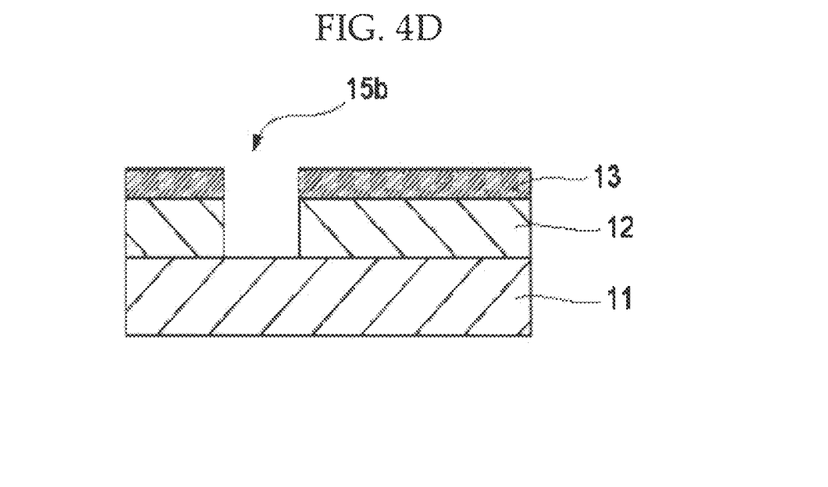
FIG. 4D is a schematic diagram for explaining the example of the disclosed method for producing a semiconductor, and illustrating a state where a hole pattern is also formed in the interlayer insulating film.
Figure 4E:
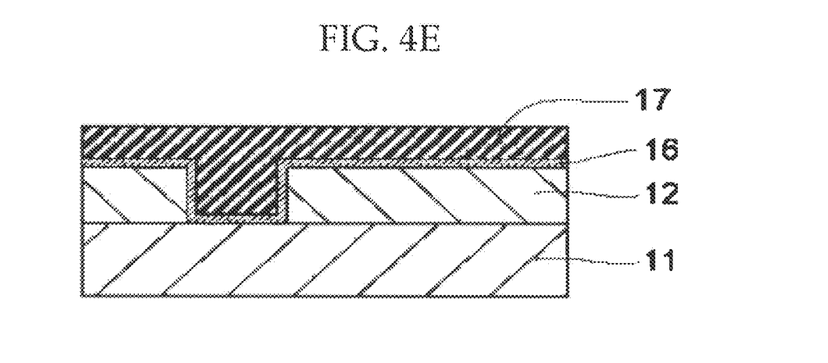
FIG. 4E is a schematic diagram for explaining the example of the disclosed method for producing a semiconductor, and illustrating a state where a Cu film is formed on the interlayer insulating film in which the hole pattern has been formed.
Figure 4F:
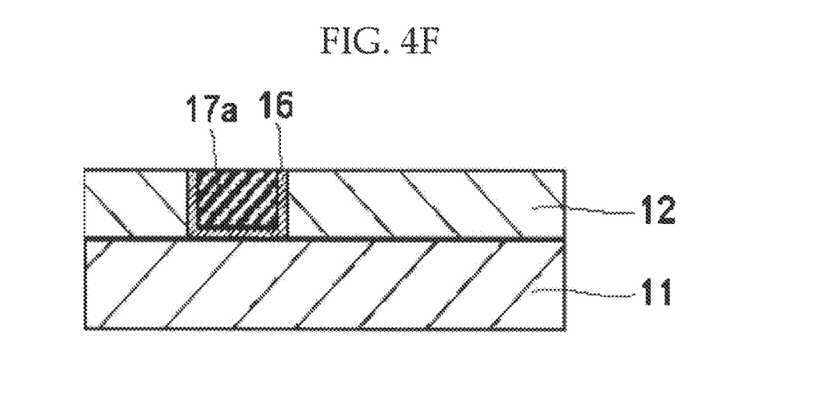
FIG. 4F is a schematic diagram for explaining the example of the disclosed method for producing a semiconductor, and illustrating a state where Cu deposited on the interlayer insulating film is removed other than the portion of Cu deposited in the hole pattern.
Figure 4G:
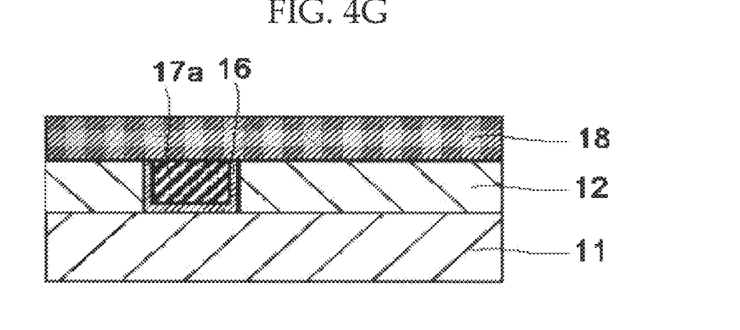
FIG. 4G is a schematic diagram for explaining the example of the disclosed method for producing a semiconductor, and illustrating a state where an interlayer insulating film is formed on the Cu plug, which has been formed in the hole pattern, and the interlayer insulating film.
Figure 4H:
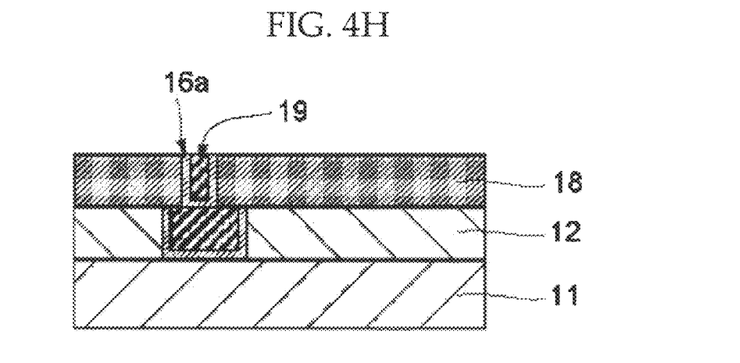
FIG. 4H is a schematic diagram for explaining the example of the disclosed method for producing a semiconductor, and illustrating a state where a hole pattern is formed in the interlayer insulating film serving as a surface layer, and a Cu plug is formed therein.
Figure 4I:
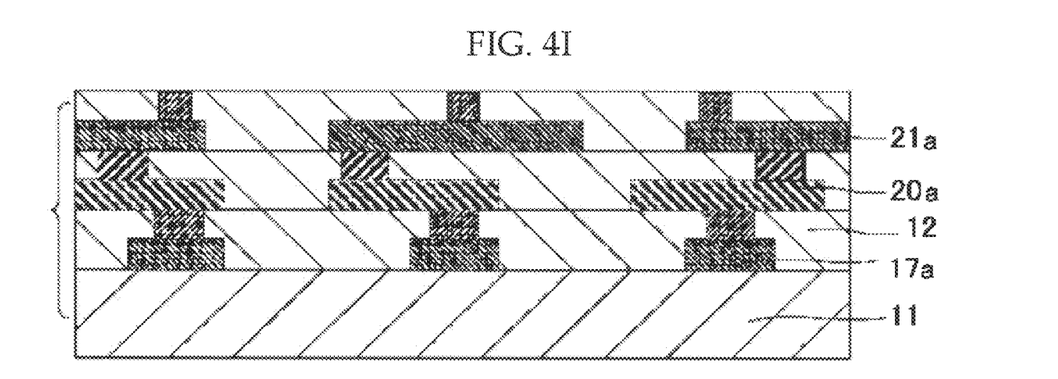
FIG. 4I is a schematic diagram for explaining the example of the disclosed method for producing a semiconductor, and illustrating a state where a wiring having a three-layer structure is formed.

As illustrated in FIG. 4A, an interlayer insulating film 12 was formed on a silicon substrate 11, and as illustrated in FIG. 4B, a titanium film 13 was formed on the interlayer insulating film 12 by sputtering. Then, as illustrated in FIG. 4C, a resist pattern 14 was formed by a double patterning method, and the titanium film 13 was patterned by a reactive ion etching using the resist pattern 14 as a mask to thereby form an opening 15a. As well as sequentially removing the resist pattern 14 by the reactive ion etching, as illustrated in FIG. 4D, an opening 15b was formed in the interlayer insulating film 12 using the titanium film 13 as a mask. Then, the titanium film 13 was removed by a wet treatment, and as illustrated in FIG. 4E, a TiN film 16 was formed on the interlayer insulating film 12 by sputtering, followed by forming a Cu film 17 on the TiN film 16 by electroplating. Thereafter, as illustrated in FIG. 4F, the surface was flattened by CMP so as to leave the barrier metal (TiN) and the Cu film in the groove corresponded to the opening 15b (FIG. 4D) to thereby form a first layer wiring 17a. Then, as illustrated in FIG. 4G, after forming an interlayer insulating film 18 on the first layer wiring 17a, as illustrated in FIG. 4H, a Cu plug (a second metal film) 19 for connecting the first layer wiring 17a with an upper layer wiring mentioned later, and a TiN film 16a were formed in the same manner illustrated in FIGS. 4A to 4F. By repeating each steps, as illustrated in FIG. 4I, a semiconductor device having a multilayer-wiring structure including the first layer wiring 17a, the second layer wiring 20a and the third layer wiring 21a above the silicon substrate 11 was produced. Note that, in FIG. 4I, the barrier metal layer formed below each layer wiring is not illustrated. In Example 2, the resist pattern 14 was a resist pattern formed by using the resist pattern thickening material of the present embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification related to a showing of the superiority and inferiority of the invention. Although the embodiments of the present invention have been described in detail, it should be understood that the various changes, substitutions, and alterations could be made hereto without departing from the spirit and scope of the invention.

The resist pattern thickening material is suitably used for thickening a resist pattern formed of an ArF resist, a resist for liquid immersion, and for forming a fine pattern such as a reverse pattern of a resist pattern and/or a wiring pattern by extending the exposure limit of light, even though using the light at the time of the exposure for patterning the resist pattern, and suitably applicable for various patterning method, a production method of a semiconductor device, and the like. The resist pattern thickening material is especially suitably used for the aforementioned formation method of a resist pattern and the aforementioned method for producing a semiconductor.

The method for producing a semiconductor device is suitably used for the production of various semiconductor devices, such as a flash memory, DRAM, and FRAM.

What is claimed is:
1. A resist pattern thickening material, comprising:
a resin;
a cyclic compound expressed by the following general formula 1;
at least one of a compound expressed by the following general formula 2 and a compound expressed by the following general formula 3; and
water,

General Formula 1 where Q represents at least one of a hydrogen atom, an alkyl group, an acetyl group, and a hydroxyalkyl group, and k represents an integer of 6, 7, or 8, General Formula 2 where R represents a cyclic structure, A represents a monovalent organic group containing a carboxyl group, m represents an integer of 1 or larger, B represents at least one of a hydroxyl group, an alkyl group, an alkoxy group, an amino group, an alkyl group-substituted amino group in which a number of the alkyl group is 1 or 2, a carbonyl group, and an alkoxycarbonyl group, and n represents an integer of 0 or larger, General Formula 3

General Formula 4 where S represents an aromatic hydrocarbon structure, X represents a compound expressed by the general formula 4, Y represents at least one of a hydroxyl group, an amino group, an alkyl group-substituted amino group in which a number of the alkyl group is 1 or 2, an alkoxy group, an alkoxycarbonyl group, and an alkyl group, p represents an integer of 1 or larger, and q represents an integer of 0 or larger, and where R1 and R2 are identical to or different from each other, and each represent at least one of a hydrogen atom and a substituent, and Z represents at least one of a hydroxyl group, an amino group, an alkyl group-substituted amino group in which a number of the alkyl group is 1 or 2, and an alkoxy group.

2. The resist pattern thickening material according to claim 1, wherein the resin is at least one selected from the group consisting of polyvinyl alcohol, polyvinyl acetal, polyvinyl acetate, and polyvinyl pyrrolidone.

3. The resist pattern thickening material according to claim 1, wherein the cyclic compound expressed by the general formula 1 is at least one selected from the group consisting of α-cyclodextrin, β-cyclodextrin, γ-cyclodextrin, methyl-β-cyclodextrin, monoacetyl-cyclodextrin, 2-hydroxypropyl-β-cyclodextrin, and 2-hydroxyethyl-β-cyclodextrin.

4. The resist pattern thickening material according to claim 1, wherein the cyclic compound expressed by the general formula 1 is methyl-β-cyclodextrin.

5. The resist pattern thickening material according to claim 1, wherein:
the resist pattern thickening material comprises the compound expressed by the general formula 3; and
the compound expressed by the general formula 3 is a hydroxybenzyl alcohol compound.

6. The resist pattern thickening material according to claim 5, wherein the hydroxybenzyl alcohol compound is either 2-hydroxybenzyl alcohol or 4-hydroxybenzyl alcohol.

7. The resist pattern thickening material according to claim 1, wherein:
the resist pattern thickening material comprises a compound expressed by the general formula 2; and
the compound expressed by the general formula 2 is phenyl lactic acid.

8. The resist pattern thickening material according to claim 1, wherein an amount of the cyclic compound expressed by the general formula 1 contained in the resist pattern thickening material is 5 mol % to 100 mol % relative to an amount of at least one of the compound expressed by the general formula 2 and the compound expressed by the general formula 3.

9. The resist pattern thickening material according to claim 1, further comprising a surfactant, the surfactant being at least one selected from the group consisting of polyoxyethylene-polyoxyalkylene condensation products, polyoxyalkylene alkylethers, polyoxyethylene alkylethers, polyoxyethylene derivatives, sorbitan fatty acid esters, glycerin fatty acid esters, primary alcohol ethoxylates, phenol ethoxylates, nonylphenol ethoxylates, octylphenol ethoxylates, laurylalcohol ethoxylates, oleylalcohol ethoxylates, fatty acid esters, amides, natural alcohols, ethylene diamines, secondary alcohol ethoxylates, alkyl cations, amide-based quaternary cations, ester-based quaternary cations, amine oxides, and betaines.

10. A method for producing a semiconductor device, comprising:
applying a resist pattern thickening material to a resist pattern formed on a processing surface so as to cover a surface of the resist pattern with the resist pattern thickening material to thereby thicken the resist pattern,
wherein the resist pattern thickening material comprises:
a resin;
a cyclic compound expressed by the following general formula 1;
at least one of a compound expressed by the following general formula 2 and a compound expressed by the following general formula 3; and
water, General Formula 1 where Q represents at least one of a hydrogen atom, an alkyl group, an acetyl group, and a hydroxyalkyl group, and k represents an integer of 6, 7, or 8, General Formula 2 where R represents a cyclic structure, A represents a monovalent organic group containing a carboxyl group, m represents an integer of 1 or larger, B represents at least one of a hydroxyl group, an alkyl group, an alkoxy group, an amino group, an alkyl group-substituted amino group in which a number of the alkyl group is 1 or 2, a carbonyl group, and an alkoxycarbonyl group, and n represents an integer of 0 or larger, General Formula 3

$[X\!\!+_{\!p}\!S\!\!+\!Y]_q$

General Formula 4

$X = \begin{matrix} R1 & Z \\ & \times \\ & R2 \end{matrix}$ where S represents an aromatic hydrocarbon structure, X represents a compound expressed by the general formula 4, Y represents at least one of a hydroxyl group, an amino group, an alkyl group-substituted amino group in which a number of the alkyl group is 1 or 2, an alkoxy group, an alkoxycarbonyl group, and an alkyl group, p represents an integer of 1 or larger, and q represents an integer of 0 or larger, and where R1 and R2 are identical to or different from each other, and each represent at least one of a hydrogen atom and a substituent, and Z represents at least one of a hydroxyl group, an amino group, an alkyl group-substituted amino group in which a number of the alkyl group is 1 or 2, and an alkoxy group.

11. The method according to claim 10, further comprising etching the processing surface using the thickened resist pattern as a mask so as to pattern the processing surface.

12. A semiconductor device, comprising:
a base having a processing surface,
wherein the semiconductor device is produced by a method comprising:
applying a resist pattern thickening material to a resist pattern formed on the processing surface of the base so as to cover a surface of the resist pattern with the resist pattern thickening material to thereby thicken the resist pattern,
wherein the resist pattern thickening material comprises:
a resin;
a cyclic compound expressed by the following general formula 1;
at least one of a compound expressed by the following general formula 2 and a compound expressed by the following general formula 3; and
water, General Formula 1 where Q represents at least one of a hydrogen atom, an alkyl group, an acetyl group, and a hydroxyalkyl group, and k represents an integer of 6, 7, or 8, General Formula 2 where R represents a cyclic structure, A represents a monovalent organic group containing a carboxyl group, m represents an integer of 1 or larger, B represents at least one of a hydroxyl group, an alkyl group, an alkoxy group, an amino group, an alkyl group-substituted amino group in which a number of the alkyl group is 1 or 2, a carbonyl group, and an alkoxycarbonyl group, and n represents an integer of 0 or larger, General Formula 3

General Formula 4 where S represents an aromatic hydrocarbon structure, X represents a compound expressed by the general formula 4, Y represents at least one of a hydroxyl group, an amino group, an alkyl group-substituted amino group in which a number of the alkyl group is 1 or 2, an alkoxy group, an alkoxycarbonyl group, and an alkyl group, p represents an integer of 1 or larger, and q represents an integer of 0 or larger, and where R1 and R2 are identical to or different from each other, and each represent at least one of a hydrogen atom and a substituent, and Z represents at least one of a hydroxyl group, an amino group, an alkyl group-substituted amino group in which a number of the alkyl group is 1 or 2, and an alkoxy group.

* * * * *